US005551028A

United States Patent [19]
Voll et al.

[11] Patent Number: 5,551,028
[45] Date of Patent: Aug. 27, 1996

[54] DESIGN DATA MANAGEMENT SYSTEM AND ASSOCIATED METHOD

[75] Inventors: Robert Voll, West Linn; William C. Berg, Beaverton; Brad Sergent, Lake Oswego; Sam Stevens, Portland, all of Oreg.

[73] Assignee: Mentor Graphics Corporation, Wilsonville, Oreg.

[21] Appl. No.: 396,336

[22] Filed: Feb. 28, 1995

Related U.S. Application Data

[63] Continuation of Ser. No. 266,327, Jun. 27, 1994, abandoned, which is a continuation of Ser. No. 663,142, Feb. 28, 1991, abandoned.

[51] Int. Cl.$^6$ ................................................ G06F 17/30
[52] U.S. Cl. ............... 395/600; 364/474.24; 364/917.96; 364/974; 364/282.1
[58] Field of Search ...................... 395/600; 364/474.24, 364/490, 491

[56] References Cited

U.S. PATENT DOCUMENTS

| | | | |
|---|---|---|---|
| 4,357,635 | 11/1982 | Hasegawa | 360/51 |
| 4,558,413 | 12/1985 | Schmidt et al. | 364/300 |
| 4,939,507 | 7/1990 | Beard et al. | 340/706 |
| 5,050,105 | 7/1991 | Peters | 364/521 |
| 5,162,992 | 11/1992 | Williams | 364/419 |
| 5,212,792 | 5/1993 | Gerety et al. | 395/650 |

OTHER PUBLICATIONS

Stan Krute, "A Few Things That Work, Something That Doesn't and a little HyperTalking", *Dr. Doobs Journal Of Software Tools for the Professional Programmer*, vol.: v13 Issue: n4, Apr., 1988, p. 106–112.

Gina Smith, "Windows 3.0 Beta Version Cracks 640K–byte Barrier", *PC Week*, vol.: v6, Issue: n22, Jun. 5, 1989, pp. 1–2.

Salvatore Parascandolo, "Cricket Color Paint", *MacUser*, vol.: v5, Issue: n10, Oct., 1989, pp. 94–95.

"Desktop Publishing: New Express Publisher 2.0 Delivers Capabilities No Other Desktop Publisher Can at $160", *EDGE: Work–Group Computing Report*, vol.: v1 Issue: n20, Oct. 8, 1990.

Hardwick et al., "Using A Relational Database As An Index to a Distributed Object Database in Engineering Design Systems", *Second International Conference on Data and Knowledge Systems for Manufacturing and Engineering*, 16–18 Oct. 1989, pp. 4–11.

Kim, Won and Banerjee, Jay, "Operations and Implimentation of Complex Objects", *IEEE and Transactions on Software Engeering*, vol. 14, No. 7, Jul. 1988.

Xerox, UP Reference Library Version 1.0, Xerox Corporation (Elsegundocacif, Sep. 1985).

*Primary Examiner*—Thomas G. Black
*Assistant Examiner*—Paul R. Lintz
*Attorney, Agent, or Firm*—Klarquist, Sparkman, Campbell, Leigh & Whinston

[57] ABSTRACT

A system and method for organizing design data in a computer system so that multiple data files can be represented and manipulated as a single entity, referred to herein as a design object. Each design object is represented graphically by a symbol on a computer display screen. Associated with the multiple data files of a design object is a software design tool such as a text editor or schematic editor. The tool may be applied to work on the data files of the design object when the design object is opened. Opening a design object is typically done by positioning the screen cursor over the symbol and then using a mouse or keyboard to open the symbol and thereby the data files and tool. Data files grouped in a design object are thus much simpler to manage than separate data files that a user must first identify, retrieve and collect before applying a tool.

18 Claims, 12 Drawing Sheets

Icon — Indicates type is "cube"

TEST — Object name

DESIGN DATA MANAGEMENT SYSTEM AND ASSOCIATED METHOD

This application is a continuation of application Ser. No. 08/266,327, filed on Jun. 27, 1994, now abandoned, which is a continuation of application Ser. No. 07/663,142, filed on Feb. 28, 1991, now abandoned.

TECHNICAL FIELD

This invention relates generally to data management systems for computers. More particularly, it relates to a graphically oriented data management system that allows a user to encapsulate software tools and the design data on which such tools operate into a single entity referred to herein as a design object. Once encapsulated, the design data is managed through a graphical interface.

BACKGROUND OF THE INVENTION

Management of data in a computer system, especially in the field of design automation, can be a complex task. Software tools such as text editors, schematic editors, and circuit simulators are employed in the process of designing products with a computer system. To work efficiently, one must not only be knowledgeable on how these software tools operate, but must also be intimately familiar with the operating system of the computer on which the tools involved run. Typically a tool must communicates with several data files in the process of performing its task. Using the commands of the operating system, one collects the relevant files and then applies the tool. The output of the tool is usually several additional data files, each of which has a filename. These additional files are then managed (copied, moved, etc) by typing the filename at an operating system command line that appears on the display terminal. To compound the complexity, multiple versions of the design data are often created by a user as his product design evolves. Each version of the design data produced by a tool may be related to specific versions of data produced by other tools. The user must then somehow keep track of this versioned data to provide for the release of a consistent group of files defining the overall product design. Effective data management thus requires thorough knowledge of the operating system, of the tool, of the files that a tool requires, and of the files that a tool produces.

One attempt to simplify management of such data is suggested by the graphical user interface provided by the Apple Macintosh computer. Each data file is represented by a file icon rather than a textual file name. To manage a file, one simply selects and opens the associated icon. Similar graphical user interfaces include Microsoft Windows, Hewlett-Packard Vue, and Sun Desktop.

Although these interfaces offer some advantage over the prior data management techniques, they have their own drawbacks which make them unsuitable for use with many tools. For example, although the data files are represented graphically, each icon represents only one data file. Opening the icon thus opens only the one associated file. One would still have to keep track of multiple data files in some manner before they could be used with a tool that required or produced such multiple data files. Moreover, none of these interfaces provides for easily tracking and managing multiple versions of design data.

SUMMARY OF THE INVENTION

DETAILED DESCRIPTION

The following described embodiment of the invention is a computer program presently implemented in C++, an object oriented programming language. The program is designed to run on conventional computer or workstation systems such as the system shown in FIG. 1, which include a video terminal with display screen 20, computer 22 with memory, keyboard 24 and mouse 26. It should be understood, however, that the invention is not limited to this embodiment. Based on the following description, the invention could as well be implemented equivalently by one skilled in the art in a number of high level programming languages, including C and Pascal, or in hardware embodiments as well.

To assist in describing the invention, terms that have a special meaning are defined in a glossary, attached hereto as Appendix A. These terms, although unfamiliar one their faces, are well understood in the art.

The Design Object

Figure 2:
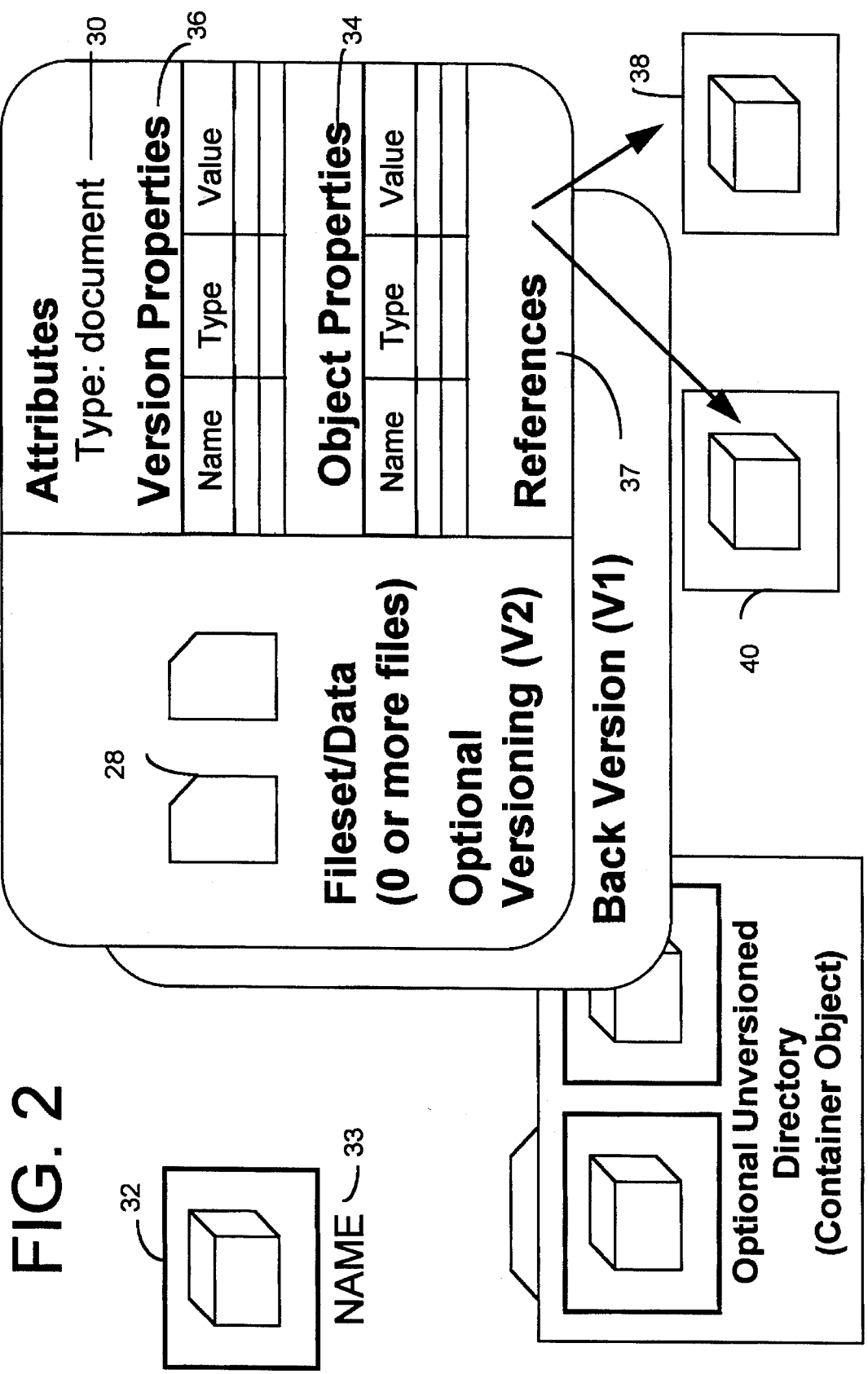
FIG. 2 is a view of a design object according to the invention.

Referring to FIG. 2, the basic element of a data management system according to the invention is the design object. A design object provides a means of organizing design data into a single entity which can be represented to, and manipulated by, users of the data management system. An object represents a set of files (indicated at 28) in the computer file system that may be treated as a single entity. The set of files that make up a design object is called the fileset. Rather than present the user with a complex set of physical files that describe various related aspects of a design, the design object presents the user with a single, representative element within the file system upon which to perform design tasks. A user can view, and invoke software design tools upon, a design object by interacting with this single representative entity, independent of the number and location of actual physical files that make up the fileset of the design object.

Using design objects, the data management system provides the user with an object-oriented view of the design data. A design object is defined by its type, such as a document type (indicated at 30). A design object's type provides a means to differentiate between design objects, and to determine which design tools can operate on the data that comprises the design object. A design object instance is a physical specimen of a particular type, such as instance 32 in FIG. 2. Each instance of a design object has a name (indicated at 33). Design objects are identified uniquely within the data management system by specifying a name and an object type.

All design object types map to one of two possible basic types. A data object is a type of design object created and edited by tool objects. A tool object is a type of design object that creates and edits data objects. The relationship between the two basic objects is such that each data object understands which tool objects can operate upon it (including one tool type specified as the default tool type), and each tool object understands which data objects it can operate upon. An infinite number of data and tool object types can be defined by adding certain attributes to the basic types, as will be described.

Figure 3:
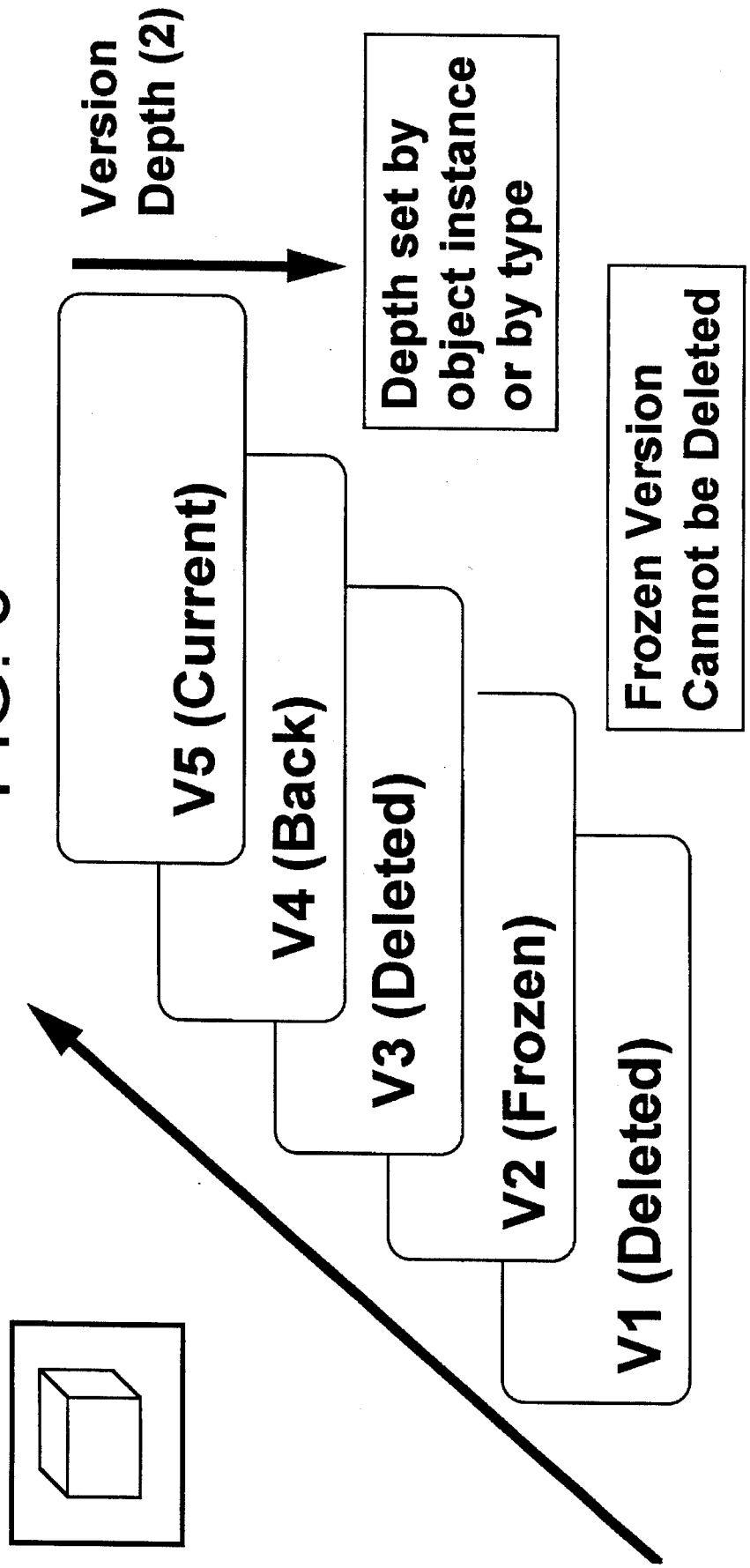
FIG. 3 illustrates the storage of multiple versions of a design object.

Referring now to FIG. 3, design objects can be versioned, or unversioned. Each time an object is edited, a new representation of the object, called a sequence version, is written out to physical disk storage within computer 22. Versioned objects have the ability to save previous representations of themselves, thus maintaining a history of the design creation process for the object. Unversioned objects maintain only a single representation, the most current one, of themselves on disk (in effect, no history is kept). Each design object type has an associated version depth, which is the number of previous versions of the object to maintain on disk. In FIG. 3, the version depth is two. Versions of an object that exceed the specified version depth for the object type are automatically removed from disk when a new version is written. This is called version pruning. The version depth of a versioned object is set to two, by default, but can range from one to infinity. In FIG. 3, versions V1 and V3 were deleted as additional versions were added on top of them. Version V2 is a frozen version, version V4 is the back-up version, and version V5 is the current version. The version depth of an unversioned object is always one, and cannot be changed since no history is kept for unversioned objects.

Design object versions can be frozen, such as version V2. Freezing a version of a design object prevents the version from being manually deleted or automatically deleted by the version pruning mechanism. Frozen versions are useful for keeping specific back versions of an object in the system. Later, if a frozen version is no longer desired, it can be unfrozen, which then makes it susceptible to version pruning if the design object history exceeds the specified version depth for the object type.

In addition to the attributes that define design object identity (name and type), users of the data management system, as well as tools, can define additional design object attributes. Such attributes are called metadata, or additional data that describes some aspect of the design object. Two types of metadata can be added to a design object: properties and references.

Referring again to FIG. 2, property is a name/value pair that can be attached to a design object. Property names and values are implemented as character strings. These properties provide additional information about the design object, such as when the object was last written to disk, what design tool performed the last edit on the design object, what user owns the design object, or an indication of the status of the object in the design process (prototype, approved, released, etc.). The properties may also be object type specific (as indicated at 34) or version specific (as indicated at 36). The data management system provides a means to add, modify, and delete design object properties. It also provides a means to view design object properties on any particular design object version of interest.

Figure 4:
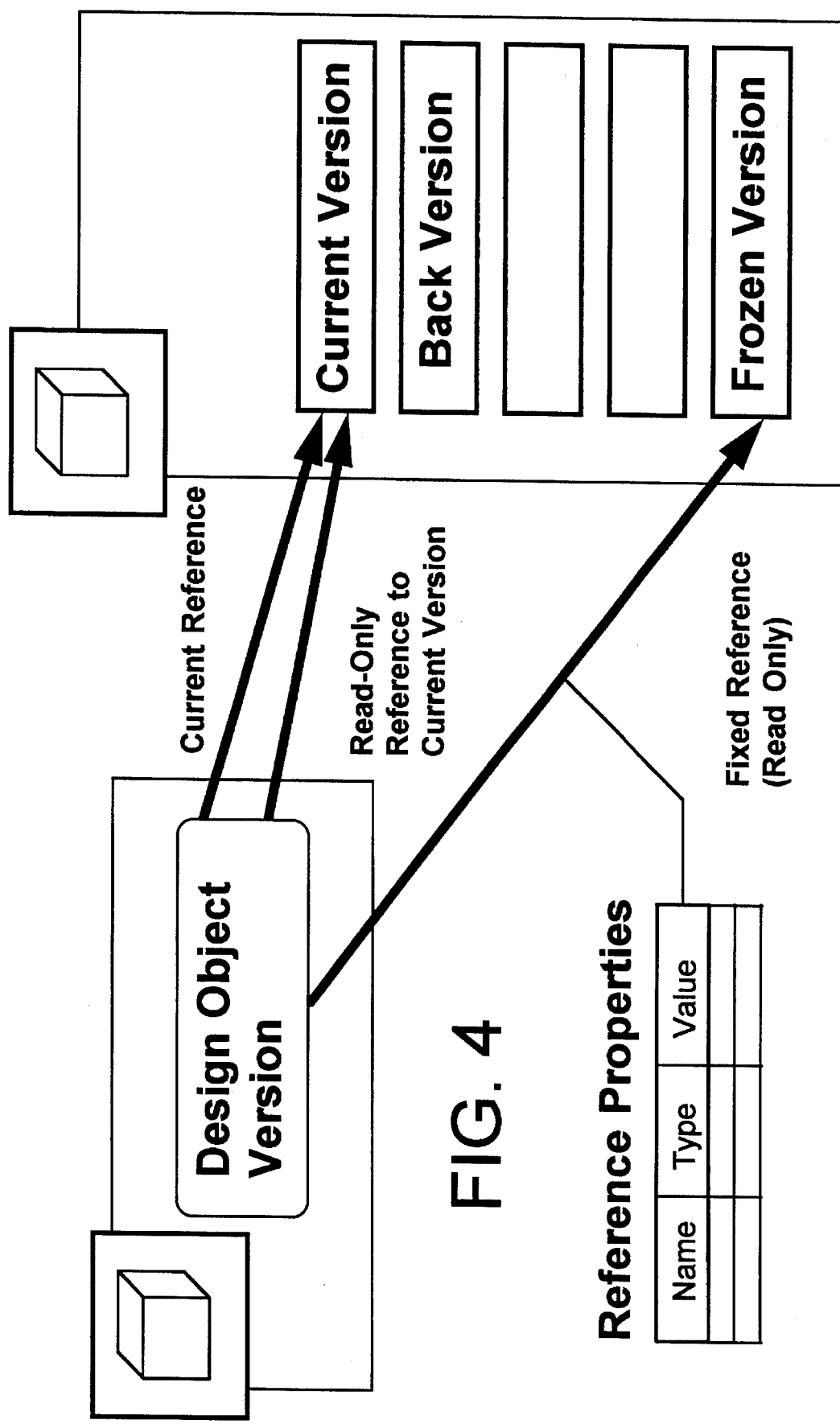
FIG. 4 illustrates the use of references to record associations between design objects.

Referring now to FIGS. 2 and 4, a reference (indicated at 37) provides a means for establishing a relationship among design objects such as instances 38 and 40, thus associating one design object with another. A reference is implemented as a character string record that contains the pathname to the referenced object, the type of the referenced object, and the version number of the referenced object.

Any design object in the data management system can be associated with any other design object in the system by creating a reference from one object to the other object. A document that describes a particular aspect of a design may be associated with that design aspect by creating a reference from the design to the descriptive document (or vice versa). The data management system provides a means to add, modify and delete references between design objects. It also provides a means to view design object references on any particular design object version of interest.

Properties can be attached to references. Such properties can be used to establish the intent, or semantic, of the reference. For example, a reference from a design schematic to a design document has a much different meaning than a reference from that same schematic to one of its logic symbols. Properties attached to a reference provide the mechanism for storing the meaning of the reference. The data management system provides a means to add, modify, and delete properties on references between design objects. It also provides a means to view properties on design object references on any particular design object version of interest.

Figure 1:
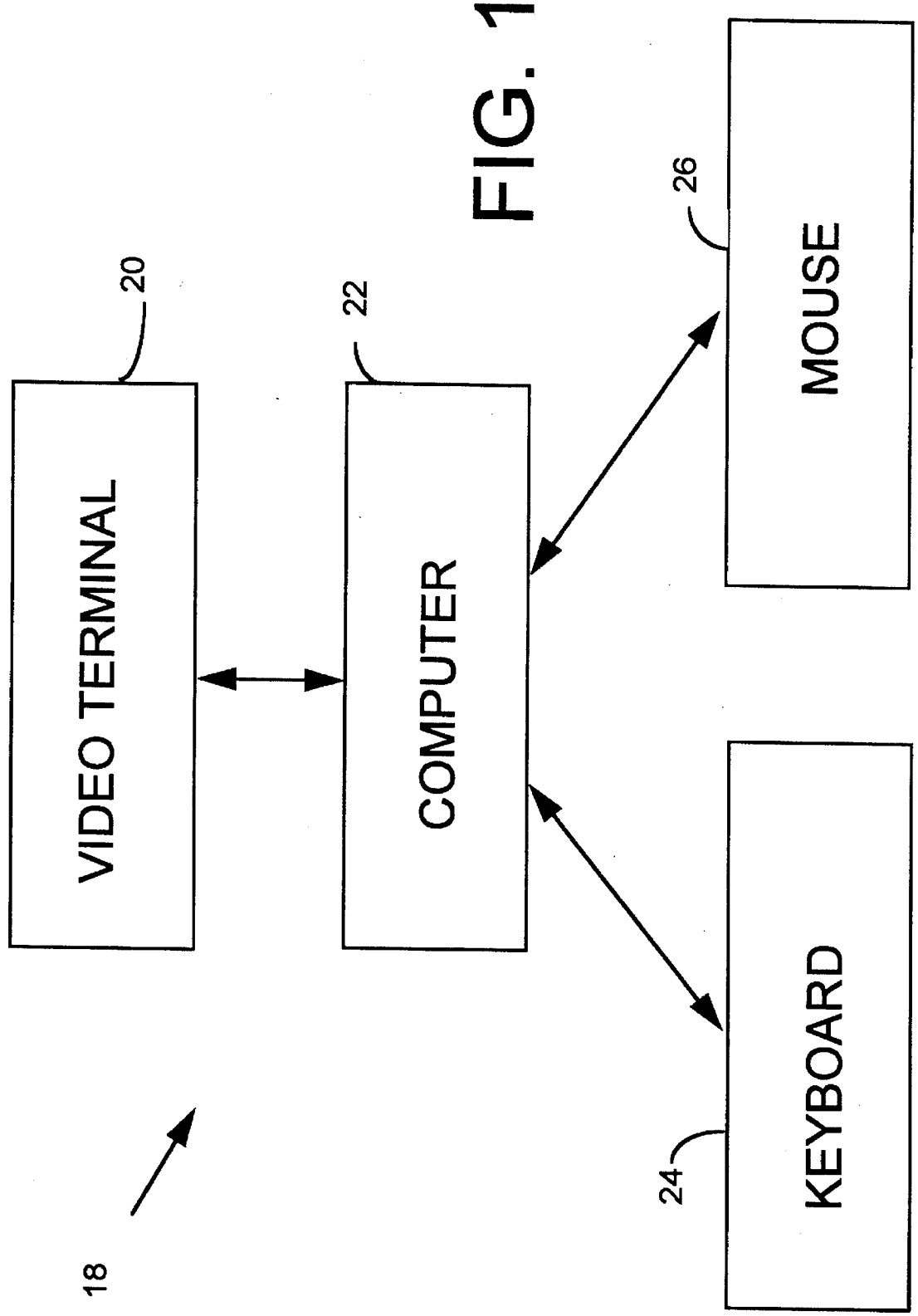
FIG. 1 is a view of a computer system in which a data management system according to the invention may operate.

All metadata is stored on a per-object basis in a file called the attribute file. The attribute file, indicated at 42 in FIG. 1, is an ASCII file that is comprised of a number of lines of text. The contents of the attribute file define the available metadata for each version of the object, and for the object as a whole. The information contained within each line is indicated by the first character in the line, called a tag. The following types of tagged lines are used to indicate specific information in an attribute file:

continuation attribute header sequence version fileset member object version header reference property A line may be continued on the next line by making the next line a continuation line.

Attribute header, sequence version, reference, object version header, and property lines must appear in the following sequence. Comments in the pseudocode below are indicated by "//" at the beginning of the comment:

```
//The following line is required first to define the design
//object identity and file format
<attribute_header_line>
//One or more instances of the following group of lines are
//required to define the version history of the object.
//Version history can be listed in any order.
<sequence_version_line>      // Sequence version record
<property_line>              // zero or more following each
                             // sequence version - these are
                             // the sequence version properties.
<fileset_member_line>        // <fileset_size> following each
                             // sequence version -
```

-continued

```
                                // these identify the names of the
                                // files in the fileset.
        ...                     // Repeat group for past versions.
//Zero or more instances of the following group of lines are
//required to define references for each sequence version. No
//object version header for a particular sequence version
//means that the sequence version of the object has no object
//properties or references. The versioned object information
//for the current version is defined first.
<object version_line>           // References for the current
                                   version
<property_line>                 // zero or more following
                                // the object
                                // version line
                                // these are the design object
                                // properties.
<reference_line>                // one or more
<property_line>                 // zero or more following each
                                // reference line - these
                                // are the references properties
        ...                     //Repeat group for past versions
The fields of each line are separated by whitespace. The first
field after the tag may follow the tag immediately. Items
enclose in brackets [ ] are optional (zero or one). Objects
enclosed in braces { } are repeated (zero or many).
Definition of continuation line:
        <continuation_line>::=
        \<additional_attributes_for_previous_
        line>
Definition of attribute header line:
        <attribute_header_line ::= A <file_format version>
                <released_flag>
                <object_type_name>
                <object_uid> <current_version_
number><version_depth>
where:
        <file_format_version> ::= <unsigned>
        <released_flag> ::=r u    //r-> released, u -> unreleased
        <object_type_name> ::= <string>
        <object_uid> ::= <ascii _uid>
        <current_version _number> ::= <unsigned>
        <version_depth> ::= <unsigned>
note:
        (1)<ascii_uid> is a uuid encoding supplied by the
        uuid_$encode( ) routine in the idl/c/uuid.h include file
        supplied on the host computer system.
Definition of sequence version line:
        <sequence_version_line> ::=
        V <uid_valid_flag> <sequence_
        version_number>
                <fileset_size> [<sequence_version_uid>]
where:
<uid_valid_flag> ::= v i     v ->uid valid, i ->uid invalid
<sequence_version_number> ::= <unsigned>
<sequence _version_uid> ::= <ascii_uid>
<fileset_Size> ::= <unsigned>
note:
        (1) <sequence_version_uid>
        is only present if <uid_valid_flag>
        = v
        (2) <fileset_size> in the header gives the number of
        <fileset_
        member_line> lines to follow
Definition of fileset member line:
        <fileset_member_line> ::=
        F <member_type> <sequence_version_
        number>
                <file_name>
where:
        <member_type> ::=       // file, container, symlink, or
        f c s o                 // opaque
Definition of object version line:
        <object_version_line> ::=
        O <sequence_version_number>
Definition of reference line:
        <reference_line> ::=
        R <reference_flags> <ref_handle>
        <reference_Path>
        <sequence_version_number> <object_type_name>
        [<sequence_version_uid>] [<object_uid>]
where:
    <reference_flags> ::=
    <reference_state><pathname_type>
    <deferred><no_uid><seq_version_uid_valid>
    <reference_state> ::-      // current (default), read-only
    c r f                      // or fixed
    <pathname_type> ::=        // hard, soft (default), in-
    h s m y                    // memory, non-filesys
    <deferred> ::= d p         // deferred (default), non-
                               // deferred
    <no_uid> ::= u n           // object uid present, no object
                               // uid (default)
<seq_version_uid_valid> ::= v i    // seq vers uid valid, no seq
                                   // vers uid (default)
    <ref_handle> ::= <unsigned>
    <reference_Path> ::= <pathname>
Definition of property line:
    <property_line>::=
    P <property_name> <property_value>
where:
    <property_name> ::= <string>
    <property_value> ::= <string>
An example of the contents of an attribute file that corresponds
to the definitions presented is given below:
    A 1 u Eddm_sheet 4ed48f316000.0d.00.01.66.d0.00.00.00 1 2
    V v 1 1 4ed490809000.0d.00.01.66.d0.00.00.00 1
    P user Fred
    F f 1 sheet1.eddm_1
    O 1
    P date_created 90/12/21
    R csduv 3 /idea/user/this/is/the/usual/path 2 Eddm_part
    \4ed4908eb000.0d.00.01.66.d0.00.00.00
4ed491c4d000.0d.00.01.66.d0.00.00.00
```

Type Definition and Registration

Figure 5:
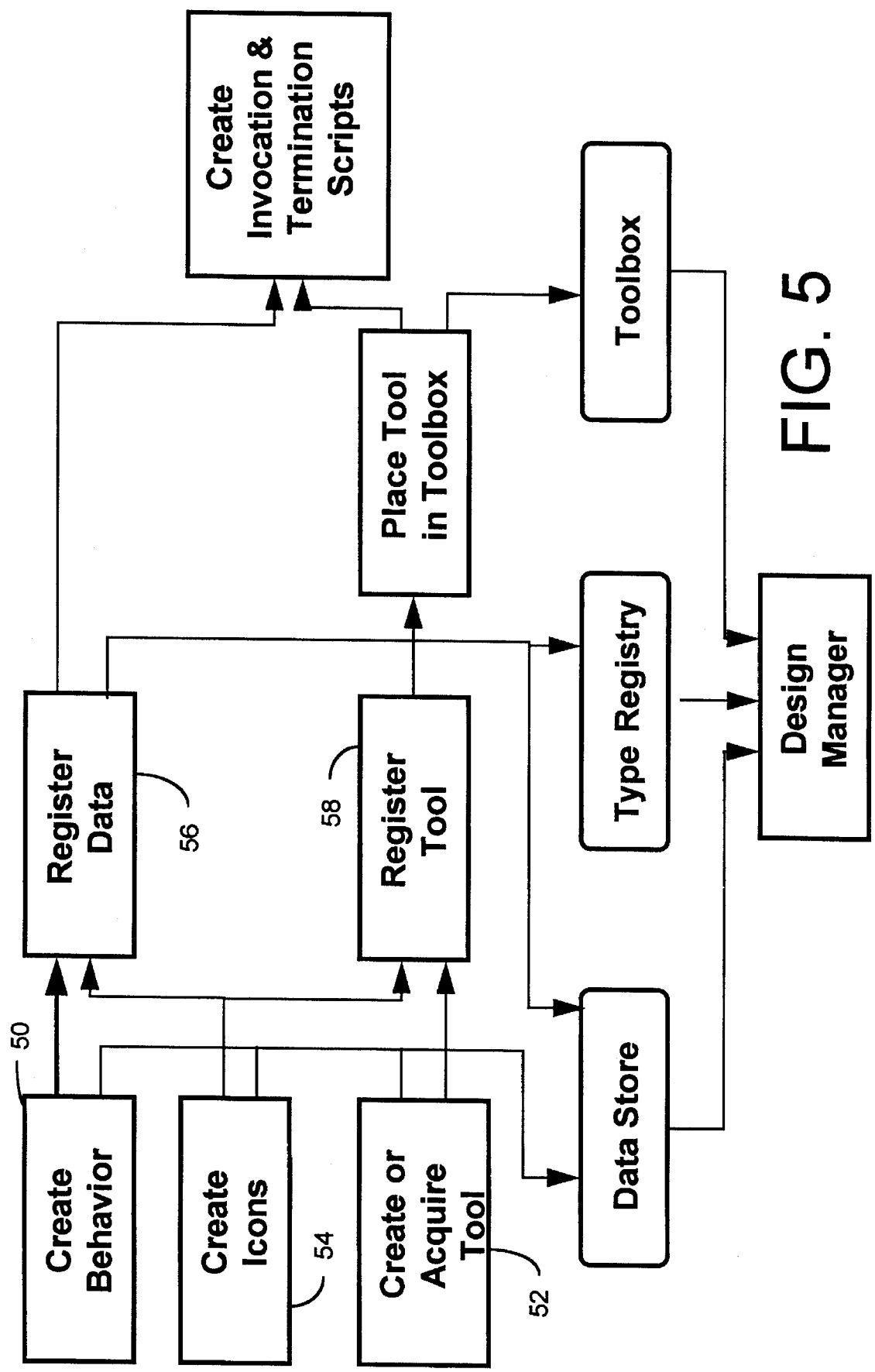
FIG. 5 is a flowchart illustrating the process for encapsulating data into a design object.

Design objects are known to the data management system by their type. Hence, there must exist a method of defining a design object type. This method is called encapsulation. FIG. 5 illustrates the different steps in the process of encapsulation for creating new types of data and tool objects. Encapsulated data types define the set of available tools that can be used within the system. One or more type definitions are contained in a type registry, which is a binary file readable by the design management system.

As mentioned previously, all design object types map to one of two possible basic types - data object type or tool object type. An infinite number of data and tool object types can be defined using the two basic types by adding certain attributes to the basic types. Properties, described previously, are used in the type definition to implement these attributes.

The following steps, indicated by numerals in FIG. 5, define the process of creating a data type.

1. Choose the behavior desired for the data type. This can be done by specifying additional or new behavior by writing specialized type code, or by inheriting an existing set of behavior from another object type. No type code is given, and the name of the base type from which to derive behavior is specified.

2. Choose a name for the data type. The name is a character string of arbitrary length.

3. Choose whether the object is versioned, or unversioned. If the object is versioned, then the property name ddms$_{13}$ versioned_object is added to the type.

4. Choose or create a default tool type for the data type (52). An instance of this tool type is invoked by default when a default open operation (double-click of the mouse 26 button) is performed on a data object of the type being defined. The default tool type is indicated by the addition of the property default_tool<tool type> to the type.

5. Create a symbol to graphically represent the data type (54). This symbol is called an icon. The data management system user would recognize the data type by visualizing its associated icon on the graphical display screen of the computer. Icons are defined by the addition of two properties to the type:
large_icon <pathname of icon file, glyph character>
small_icon <pathname of icon file, glyph character>
where:
pathname of icon file is a character string that indicates the location in the computer system of the file containing the icon, and glyph character is the representative character within the icon file The large_icon property indicates the icon to be displayed when using an iconic display navigation mode within data management system. The small_icon property indicates the icon to be displayed when using the list display navigation mode within data management system.

Figure 6:
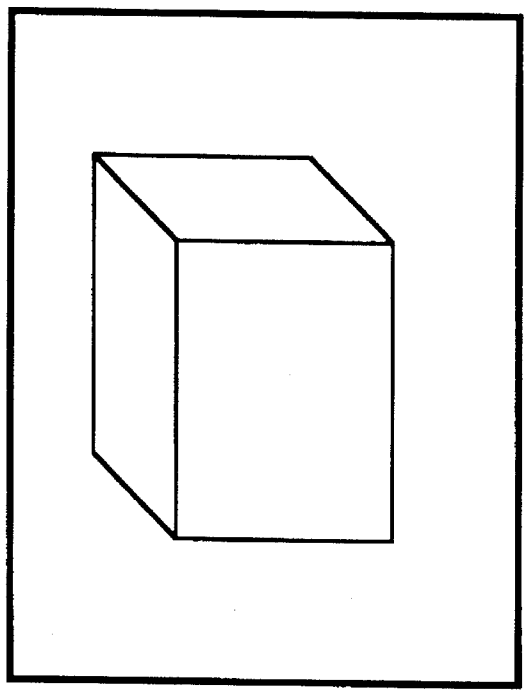
FIG. 6 is a view of an instance of a data type design object.

6. Define the fileset for the data type. For example, FIG. 6 shows an example of a data object instance named "test" of object type "cube". The user would visualize object "test" in the data management system as an icon representing type "cube" name "test". The fileset is defined by the addition of the property fileset def <>fileset specification> to the type, as follows:

```
<fileset specification> ::=
<extension>!<occurrence>!member type>
where:
    <extension> ::= <string>        // the leaf of the file
                                       system pathname
    <occurrence> ::= kro            key, required or optional
    <member type> ::= fcs           file, container or symbolic link
```

The following steps define the process of creating a tool type:

1. Choose a name for the tool type. The name is a character string of arbitrary length.

2. Create a symbol to graphically represent the tool type (54). This symbol is called an icon. The data management system user would recognize the tool type by visualizing its associated icon on the graphical display screen of the computer. Icons are defined by the addition of two properties to the type:
large_icon <pathname of icon file, glyph character>
small_icon <pathname of icon file, glyph character>
where pathname of icon file is a character string that indicates the location in the computer system of the file containing the icon, and, glyph character is the representative character within the icon file.

The large_icon property indicates the icon to be displayed when using an iconic display navigation mode within data management system. The small_con property indicates the icon to be displayed when using the list display navigation mode within data management system.

3. Define a set of data types upon which this tool type can operate. This set is defined by the addition of the property valid_tools_list_<data types> to the tool type. The information in <data types> can be one or more data types, indicated by data type name, separated by a blank space. The tool type being defined can either create or edit instances of data types in the data type list. The tool is restricted to operate only on data types in this list. The tool can be indicated as the default tool by one or more of the data types in this list.

There is no requirement to define a fileset for a tool type, since all tool instances have the same structure on disk.

Once these data and tool types are defined, they must be loaded into the data management system to be known by the system. A method exists to make these defined types known to the data management system. This method is called type registration, indicated by blocks (56) and (58) in FIG. 5.

Data and tool types are contained in files called type registries. A type registry can contain one or more data and/or tool type definitions. The contents of a type registry (the data and tool types) can be loaded into the data management system by causing the data management system to read the contents of the type registry into program memory. The contents of all type registries read by the data management system are held in a data structure called the type manager.

After a type registry is loaded, all the types contained in the registry are known to the data management system. The data management system can, at this time, recognize instances of data and tool types as defined in the type definitions for those types, and can invoke tools on data to create or edit instances of the data. The tool invocation process in the data management system includes a means of controlling the invocation and termination sequence for the tool.

Figure 7:
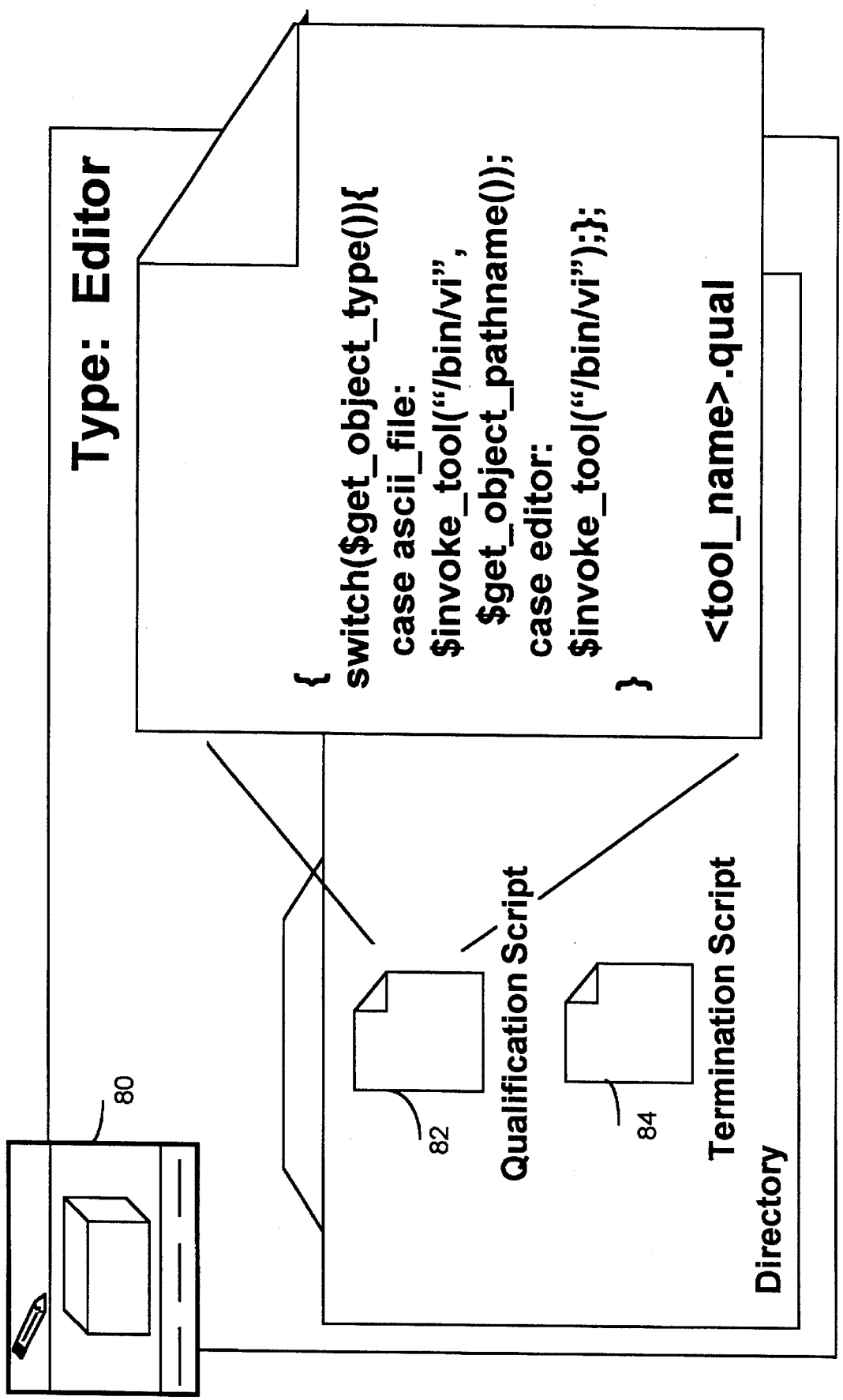
FIG. 7 is a view of an instance of a tool type design object, referred to herein as a tool viewpoint.
Figure 8:
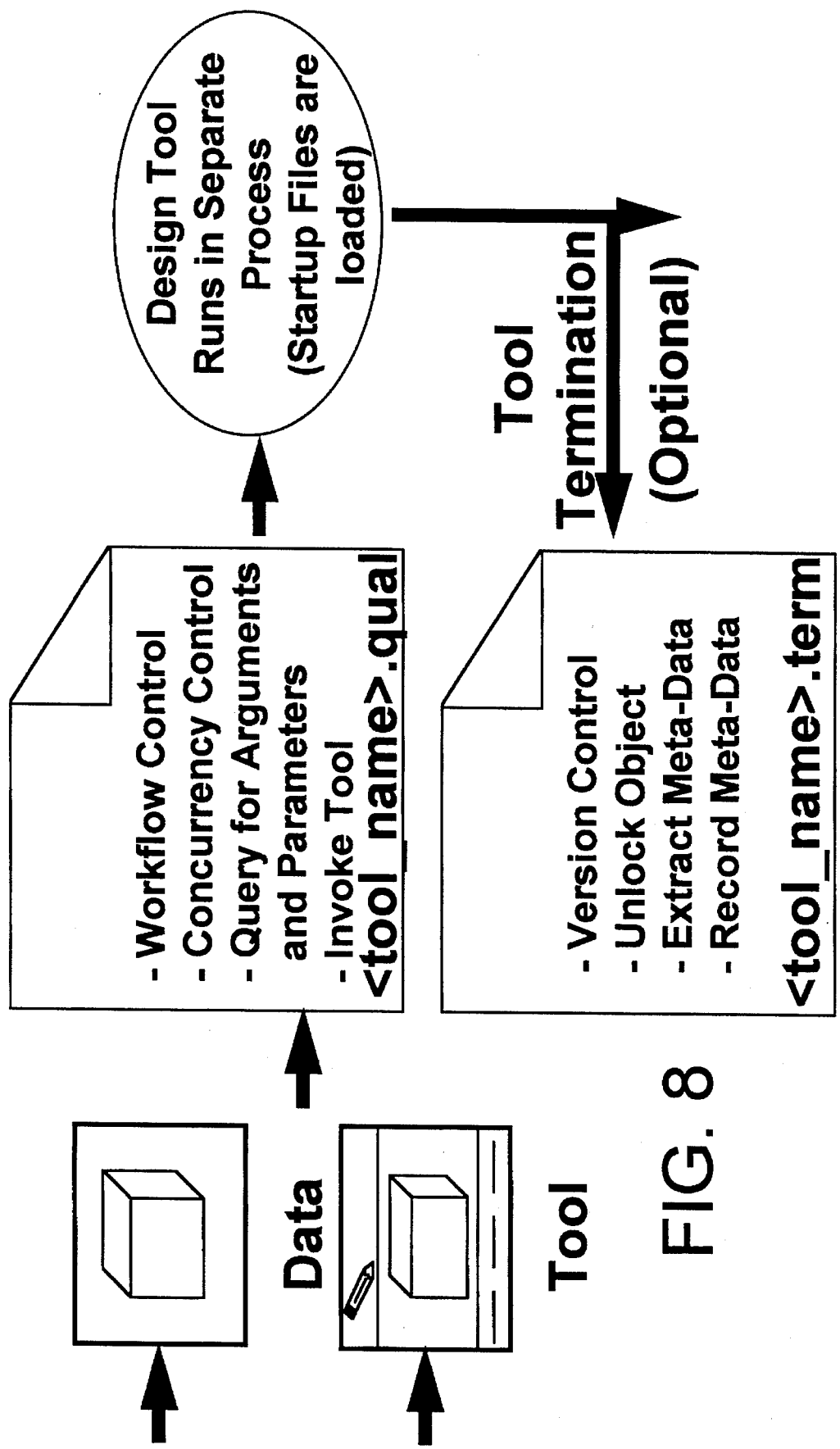
FIG. 8 illustrates the use of qualification and termination scripts with a tool viewpoint.

Referring to FIG. 7, an instance 80 of a tool (called a tool viewpoint) is shown. A tool viewpoint controls the invocation and termination of a tool (FIG. 8). For each tool, a qualification script is used to define to the data management system how to invoke (start) the tool. This script is written in a procedural programming language of a kind known in the art, which is provided as part of the operating environment within the data management system. The qualification script 82 gathers information from the data management system about the data object upon which to invoke the selected tool, such as the name of the data object, and its type. Based on the object name and type, decisions can be made about how to invoke the tool, if choices exist. Some examples might be:

"Only invoke this tool if certain steps in the design process have been completed . . . "

"Invoke this tool in the background . . . "

The choices presented depend on those possible for the particular tool invocation scheme. Successful execution of the qualification script causes a new process to be created on the computer, and the tool to begin running in that new process. UNIX vfork and exec calls are used to create the new process, and start the tool. The tool 80 then creates or edits the data associated with the data object. Multiple processes can be executed by a single qualification script.

For each tool, a termination script 84 can optionally exist. This script is also written in the procedural programming language. The termination script 84 defines how to "clean up" after the tool executes to completion. A termination script can be used to control or cause actions to occur based on how the tool executed, how it terminated (normally, or with some error condition), or to clean up temporary data that might remain after the tool completes. Termination scripts start execution with a snapshot of the data environment available at the time the tool process was invoked, in effect, restoring the context at the time the tool was invoked. This can be used to pass data from the qualification script to the termination script for processing after completion of the tool.

The Design Management System Environment

Figure 12:
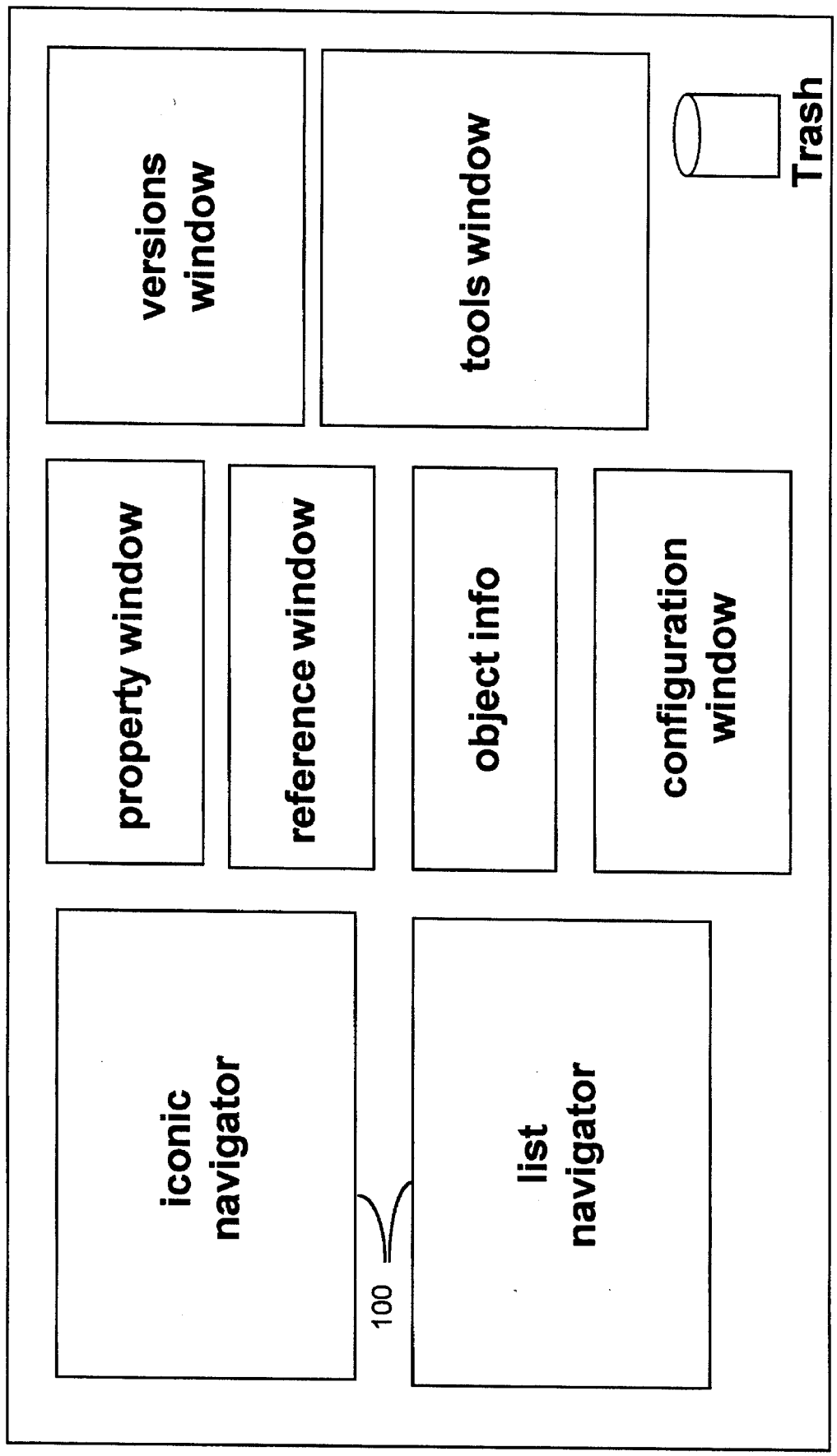
FIG. 12 is a screen display showing the different portions of the design management system interface for managing design objects.

Referring to FIG. 12, the data management system includes an interface that provides capabilities for managing (i.e. organizing and manipulating) design data represented by design objects. The data management system can manage individual objects, but also provides facilities to manage groups of objects as an interrelated entity.

As discussed above, the data management system provides a mean for dynamically extending the number of design object types known to the environment. This is done by causing the data management system to perform a file system read operation on a type registry file, the result of this operation being the loading of the types contained in the registry into the data management system. The object types read into the system can be data types and/or tool types.

Once the data management system contains the necessary object type definition, it can recognize design objects within the computer filesystem through a process called object recognition. Object recognition occurs when the user goes to a container, the process of going to a particular container being known as navigation. The container may contain various entities, such as files, links or other containers. The object recognition algorithms in the data management system group together appropriate filesystem entities within a container into design objects, according to the type definitions loaded into the data management system type manager. If design objects are found in a container, the appropriate icon that represents the design object is displayed to the user in a window called the Navigator Window 100. A navigator can display objects in either an iconic form, using the large icon defined in the type definitions for the objects in either an iconic form, using the large icon defined in the type definitions for the objects, or in a list form using the small icon defined in the type definitions for the objects.

Two modes of navigation are provided. Navigation-by-containment allows for recursive descent and ascent through the design object hierarchy by selecting a design object that is a container design object and performing an Explore Contents to push down into the object hierarchy. Navigation-by-reference allows for the recursive traversal of the design object reference hierarchy by selecting a design object that has references and performing an Explore References to traverse across the object reference hierarchy. In both navigation modes, the user can return to the last location visited in either hierarchy by performing an Explore Parent. Each of the Explore operations (as well as Go To, which jumps to a specified location) is performed by clicking on the appropriate button arrow in the navigator window 100.

Figure 9:
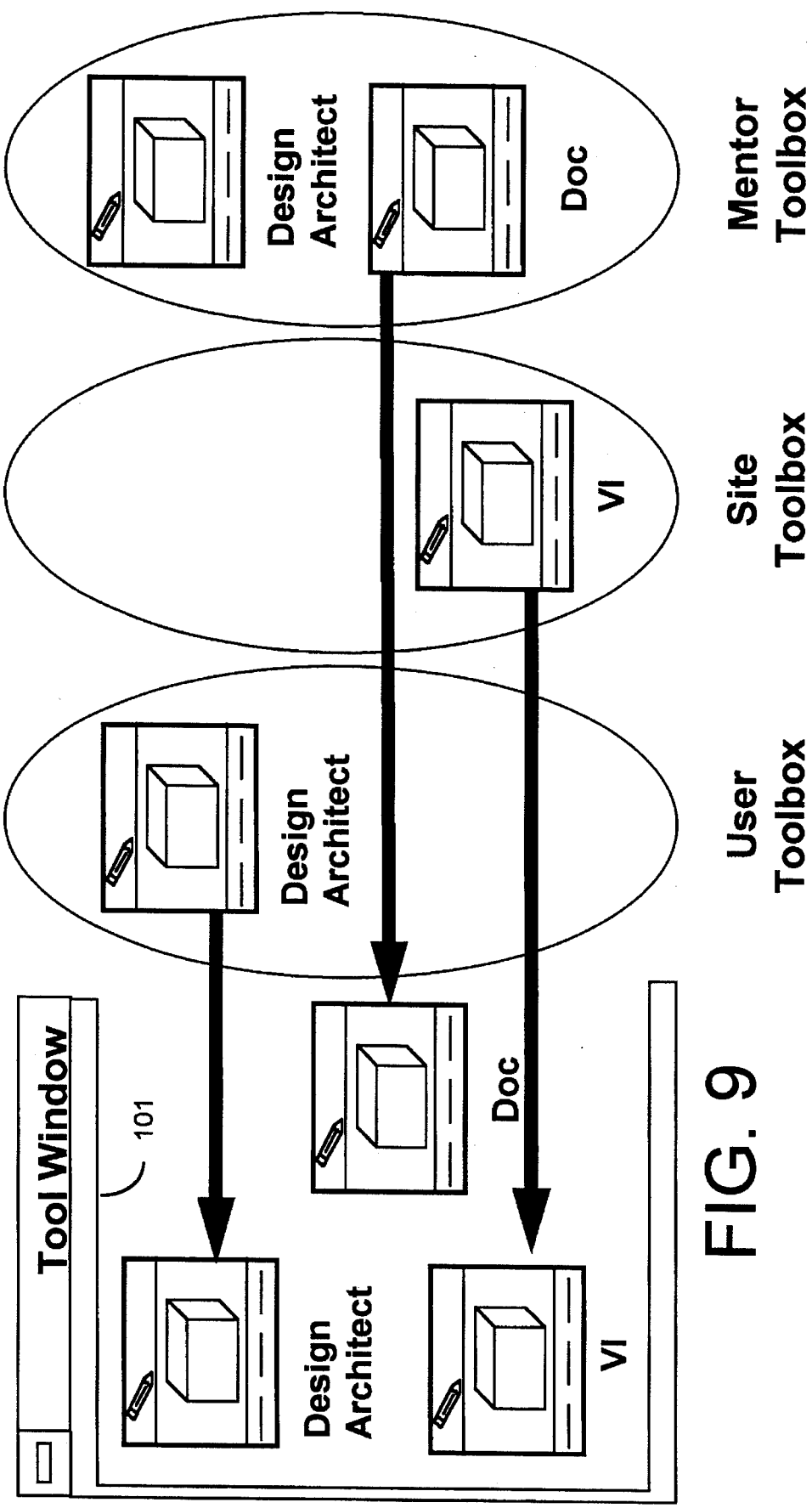
FIG. 9 illustrates a file system directory that contains tool viewpoints.

Design tools can also be dynamically added to the tools provided by the data management system. Tool type definitions are read into the data management system by reading them from a type registry, as noted. Instances of tool types (the tools themselves, such as a schematic editor or a text editor) are added to the data management system by specifying the location in the filesystem of a toolbox, as illustrated in FIG. 9. A toolbox is a file system directory that contains tool viewpoints. A toolbox is used to organize tool viewpoints into groups that make logical sense to the user (e.g. all simulation tools are in one toolbox, all editing tools in another, all tools from a particular tool vendor in another, etc.). All unique tools are displayed to the user in a centralized view window within the data management system called a Tool Window indicated at 101 in FIG. 9.

Tools can be invoked to create or edit data objects several ways.

If the user performs a double-click of the left mouse button while holding the location cursor over an icon in a Navigator Window 100, the default tool will be invoked for the design object represented by the icon.

If the user performs a single-click of the left mouse button while holding the screen cursor over an icon in the navigator window 100 (performing a select of the object), and then performs an Open command, a list of valid tools is displayed. The list of valid tools as defined is derived from the input+data information on the type definition for all tools currently loaded into the data management system. From the list of valid tools, the user would select a single tool for execution.

If the user performs a double-click, or a single-click/Open while holding the location cursor over an icon in the Tools Window, the tool will invoke on a blank, or untitled, data object. For those tools where this is not possible, the tool can prompt the user for a data object by adding the appropriate query to the qualification script for the tool.

The data management system provides a means of deleting one or more objects from the environment. Object deletion involves deletion of the fileset members associated with the design object from the filesystem. Object deletion is performed by selecting an object and executing a Delete Object command.

The data management system provides a means of adding and deleting references between design objects. References are added by selecting an object, calling the command to add a reference, and specifying the target object to reference. Deleting a reference involves selection of the reference from a list of possible references on a selected object, and performing a Delete Reference command.

The data management system provides a means of creating, editing and deleting properties on both design objects and references. A property name/value pair can be added by selecting an object or reference and performing either an Add, Edit, or Delete Property command.

The data management system provides a means for displaying information about a selected object within the environment. After selecting an object, the Report Info command is performed, which lists:

the object name;

the object type;

the physical location of the object in the computer filesystem;

the version of the object about which information is being displayed;

the version depth of the object (how many back versions to save);

the protection status of the object (can I read or write the object?);

the lock status of the object (can the object be accessed, or is it locked?);

the release status of the object (is the object part of a released configuration?);

the date the object was last modified (written to disk);

the properties on the object; and the references from this object to other objects in the environment.

The data management system provides a means of making a copy of an object to another location in the filesystem. Either the entire object, or a specific version of the object, can be copied. This is performed by doing a Copy Object command on a selected object. References between objects that are part of the set of copied objects are automatically modified to point to the copied objects at their new locations.

The data management system provides a means of moving an object from one location to another in the filesystem. A version of an object cannot be moved separately; the entire object must be moved. Move is performed by doing a Move Object command on a selected object. References between objects that are part of the set of moved objects are automatically modified to point to the moved objects at their new locations.

The data management system provides a means of changing the name of an object by selecting the object and performing a Change Name command.

The data management system provides a means of changing the version depth of an object by selecting the object and performing a Change Version Depth command. This allows the user to control how much history to save on a per-object basis.

The data management system provides a means of changing the access protections of an object by selecting the object and performing a Change Protection command. Read, write, and execute protections can be modified. These protections map to the standard permissions found on UNIX systems.

Figure 10:
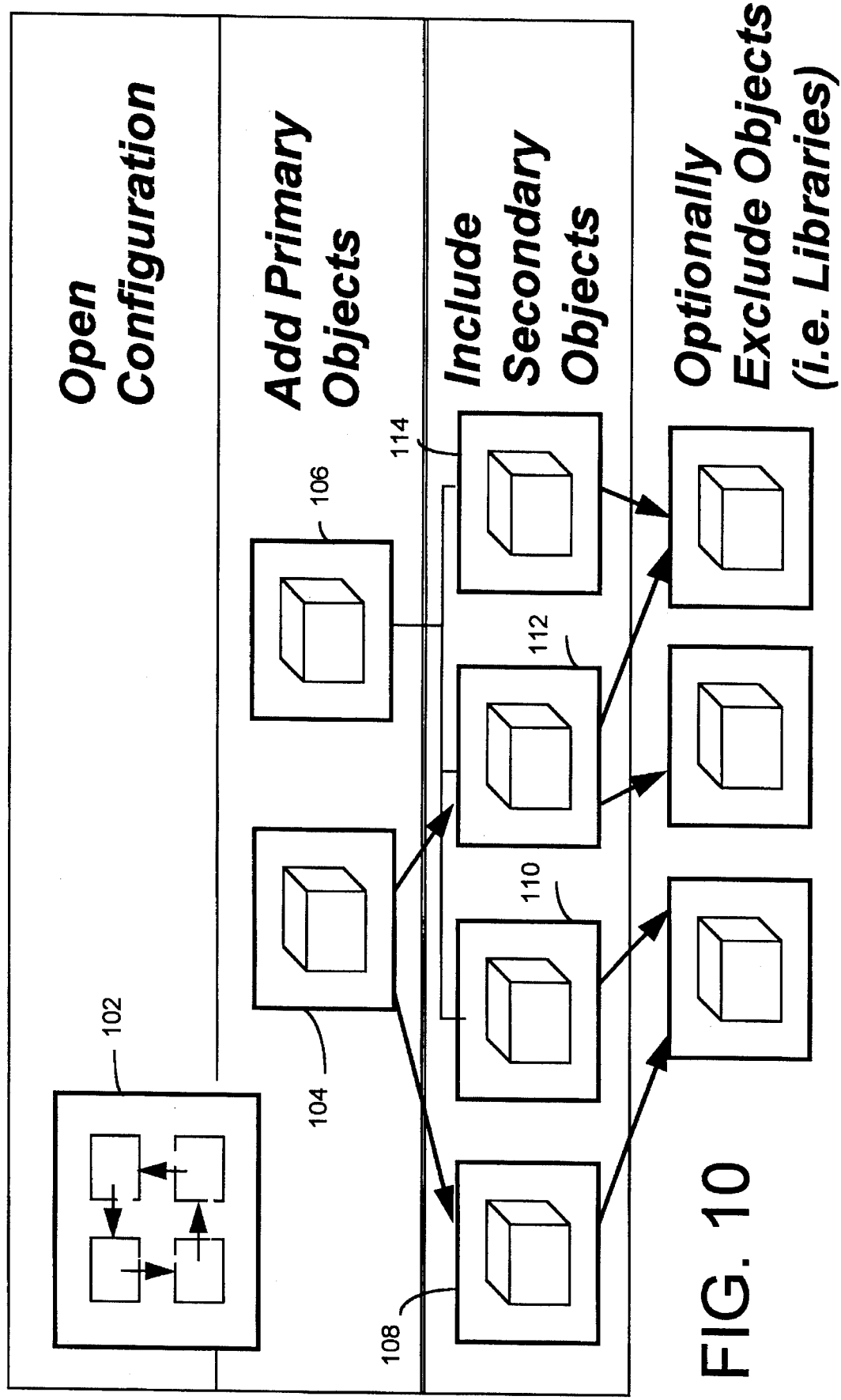
FIG. 10 is a view of a group of related design object instances referred to herein as a configuration.

The data management system provides a means of grouping a set of design objects into an entity that can be manipulated as a whole. This group of related objects is called a configuration and is illustrated in FIG. 10 at 102. Objects in a configuration are related through either containment or reference. A configuration object is a type of object used to keep track of related objects within a configuration. The configuration object uses the reference and property capabilities of the data management system to perform grouping of objects in the configuration.

Objects added directly to the configuration by a user action are called primary objects, such as objects 104 and 106. Primary objects usually represent some significant, or primary, piece of design data to which other data is related.

Objects added to the configuration as a result of being related to a particular primary object are called secondary objects, such as objects 108, 110, 112 and 114. The configuration object uses a set of rules specified per primary object to determine what secondary objects to include in the configuration. These rules specify the following:

1. The version of the primary object to be included in the configuration. This specific version is used to determine what secondary objects to include. The default version of the primary object includes the current version.

2. The containment traversal rule. By default, if the primary object is a container object (i.e. it contains other design objects), the containment hierarchy is recursively descended and any objects within the hierarchy are added to the configuration as secondary objects. Optionally, the rule could be specified such that contained objects are not included in the configuration.

3. The reference traversal rule. By default, if the primary object has references to other objects, the reference hierarchy is recursively traversed and any referenced objects within the hierarchy are added to the configuration as secondary objects. Optionally, the rule could be specified such that referenced objects are not included in the configuration.

Filters to apply to the list of secondary objects generated from Rule 2 and Rule 3, above. These filters limit the number of secondary objects added to the configuration by either causing secondary objects to be excluded, or causing secondary objects to be included. Filters can be specified in four ways:

1. Containment pathname filtering allows the user to specify certain objects be included or excluded from the configuration based on their filesystem pathname.

2. Object type filtering allows the user to specify that only certain types of design objects be included or excluded.

3. Object property filtering allows the user to limit the objects that are included or excluded based on design objects properties and their values.

Once a list of primary objects has been added and the build rules are specified, a build operation is performed. The build operation takes the list of primary objects, applies the inclusion and/or exclusion rules specified per primary, and creates a list of secondary objects, adding them automatically to the configuration. Objects are added to the configuration by creating a reference from the configuration object to the primary or secondary object to be included.

Figure 11:
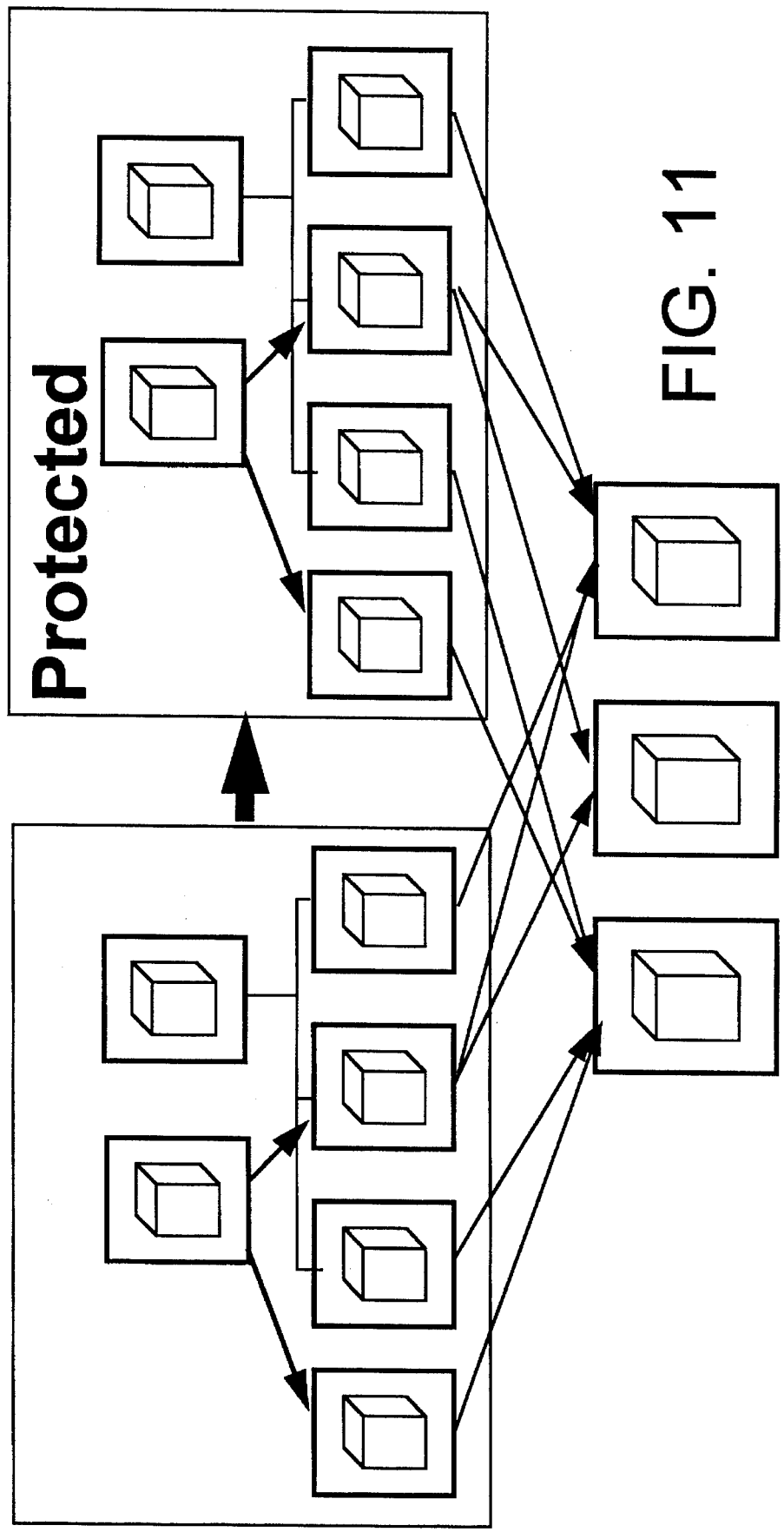
FIG. 11 illustrates operations that may be performed on the design management system on a configuration.

After a configuration 102 is built, a certain set of data management system configuration operations can be performed on the configuration, as shown in FIG. 11.

The configuration can be locked to prevent design objects in the configuration from being changed during additional configuration operations.

The objects in a configuration 102 can be copied as a set to another area of the filesystem, and can be marked to prevent their further evolution. This process is called release. All relationships between objects in the old location are maintained in the new location. References between objects that are part of the set of released objects are automatically modified to point to the released objects at their new locations.

The objects in the configuration 102 can be frozen. Frozen design objects have been described earlier in this document. Unfreezing of configurations is also provided.

The objects in the configuration 102 can be deleted. This causes all objects called out in the configuration to be removed from the filesystem.

Having illustrated and described the principles of the invention in a preferred embodiment, it should be apparent to those skilled in the art that the invention can be modified in arrangement and detail without departing from such principles. We claim all modifications coming within the spirit and scope of the following claims.

APPENDIX A

Glossary of Terms attributes
    Information associated with a design object to define
    its characteristics. Standard attributes define the
    object type and identity. Additional user_defined
    attributes can be added to objects using properties for
    storing data and references for storing design
    associations.
attribute file
    A special file contained within a design object used to
    store all attribute information about that design
    object. This information includes object type,
    identity (user ID), user_defined properties, and design
    object references. An attribute file can be identified
    by its .attr suffix.
behavior
    A design object has a behavior which is a set of
    operations that can be performed by the object. The
    basic set of operations that can be performed by all
    design objects is defined by a type named Ddms_do.
configuration
    A collection of design objects that describe a design.
    These objects can be related by containment and
    reference.
configuration object
    A special type of design object that specifies how a
    configuration is built. A configuration object is
    versioned, it references primary and secondary design
    objects, and records build rules for each primary
    design object.
containment hierarchy
    The organization of design objects held in containers.
    A container may hold containers which in turn may hold
    other containers, creating a hierarchy of container
    objects. A directory structure is a containment
    hierarchy because the system treats directories as

APPENDIX A-continued

Glossary of Terms containers by default.

container
: A special design object for containing other design objects. By default, the design management system treats file system directories as containers. File system containers enhance basic directory functionality because they are design objects which can have attributes attached to them.

Design Data Configuration Management
: The process of managing configurations. Design Data Configuration Management performs tasks such as copying, moving, and releasing a design.

Design Management Environment (DME)
: The name for all design management facilities including integrated design data configuration management, navigation, tool invocation, and the type registration.

Design manager
: A graphical interface to the Design Management Environment. The Design manager provides access to design tools and data and allows a user to manage design configurations (collections of design objects). The Design Manager supports three primary tasks: design navigation, tool invocation, and design data configuration management.

design object
: A typed collection or grouping of all the files representing some aspect of design data. The design object behavior is defined by its type. Using the design management system, a design object provides a single consistent entity that a user can operate on (e.g. invoke a tool, copy, move, release, . . .).

encapsulation
: The process of integrating design tools or design data. Encapsulation controls how tools and data are used without affecting the tool or data itself.

file
: A unit of storage, regardless of the form of the repository within which the unit of storage resides.

fileset
: A collection of files which taken together comprises all aspects and versions of a design object.

frozen version
: A version of a design object that cannot be deleted by the version depth mechanism. Frozen versions are used to save a particular version.

instance
: An actual specimen of a particular type of design object.

leaf
: A leaf is the name of the tool or data in the file system, without any pathname. For example, given the filename /usr/tmp/ginko/doc_mgc, the leaf is doc_pgc.

navigation
: The process of traversing the containment hierarchy and reference structure of design objects. Using two windows, one can view both containers and references simultaneously.

properties
: Attributes that store tool- and user-defined information about a design object or a reference. Properties consist of a name and a value. Examples include the name of the engineer assigned to the project paired with his phone extension, as in Joe Smith, ext. 2449, or the current release status of a design object paired with a release number. For example, Beta Release, 15.2.

qualification script
: A program script that runs prior to invoking a tool. The purpose of the qualification script is to gather and evaluate tool arguments, validate tool invocation, and enforce workflow policies or procedures (if desired).

references
: Attributes that describe an association between design objects. Both design tools and the user can create references. one can define a references to either an explicit version of a design object or the current version. Properties can be added to references to store information about the reference.

registrar
: A tool used to register (declare) design tools and data with the Design Environment. One must register new tools and data with the type registry or the Design Manager will not recognize them. The Registrar is a graphical tool that does not require knowledge of C++ to perform the registration process.

registration
: The process of describing and defining information about how a design tool or data is encapsulated into the Design Environment. Registration is done with the registrar.

registry
: A file that contains type definitions for design data objects and tool viewpoints.

session window
: The outermost bounded area bordered by a rectangle box. It is within this area that one operates the Design Manager.

termination script
: An optional program script that runs in the Design Manager session after the design tool has terminated its process. This script performs cleanup functions required by the design tool. The termination script also provides the Design Manager with essential configuration management information, when needed.

tool
: Software created for a specific task. Examples of design tools include text editors and schematic editors. The Design Manager represents tools with icons.

toolbox
: A container where tool viewpoints are kept. An arbitrary number of toolboxes can exist.

toolbox search rule
: Specifies the order in which toolboxes are searched. The order determines which tool viewpoints are displayed in the Tool window. Given two tool viewpoints with the same name but in different toolboxes, the first tool viewpoint found is the one displayed.

tool invocation
: The process of opening a tool. Both tool-centered (invoke the tool) and data-centered (open the data) methods of tool invocation are available using the Design Manager.

tool viewpoint
: An encapsulation of a design tool that provides the user with a particular view of that tool. A tool viewpoint defines the manner in which a design tool is invoked and terminated. One can have multiple tool viewpoints to the same tool, each invoking the tool in a different way.

type
: A description of the attributes of a data design object or tool viewpoint. Type information includes the file extensions for the files in the object and the icon used to display the object in the Design Manager.

version
: A specific representation of a design object at a specific point in time. If one changes a design object's data and saves it to disk, one creates a new version of the design object.

version depth
: A design object attribute that specifies the number of versions, including the current version, that are kept after changes are made to the data (see version). Version depth can be set from one to infinity.

versioned object
: An object that uses a copy-on-write file manager. When saved to disk, a versioned object creates a new version of itself, saving the previous version.

termination script
: A program script that runs after the design tool has terminated its process. This script performs cleanup

APPENDIX A-continued

Glossary of Terms functions required by the design tool. The termination script also provides the Design Manager with essential configuration management information, when needed.

APPENDIX B

Operations Defining Design Object Behavior

Naming operations:
  uido;
  // Return the Id of this object.
  name( );
  // Return the name of this object.
  do_pathname( );
  // Return the full design object pathname of this object.
  type( );
  // Return this object's type.
Fileset Management:
  fileset_size( );
  // Return the number of files in this object's fileset.
  file( );
  // Return the name of a file in the design object's file set.
  // file_mode( );
  // Return the file mode (key, required, optional) for the requested file.
  file_type( );
  // Return the file type (container, file, link) for the requested file.
  fileset_Member( );
  // Return a file object for a requested file.
  complete_fileset( );
  // Get a file objects for all files in the fileset.
  size( );
  // Return the size of the object in persistent store.
Containment:
  do_container( );
  // Return the container which holds this design object.
  is_container( );
  // Test for whether this object can physically contain other objects.
  object_entry_names( );
  // Return name and type information about all contained objects.
  check_conflict( );
  // Check the given container for conflicts with the new object.
Session support:
  lock( );
  // Get a lock for this design object.
  lock_as( );
  // Generate a new persistent object with a new name and grab a lock.
  locked( );
  // Return the state of the design object lock.
  unlock( );
  // Remove the lock for this design object.
  lock_type( );
  // Return the lock type (exclusive, shared) for this object.
  lock ___mode( );
  // Return the lock mode (create version, annotate, no modify).
  lock_mode( );
  // Set the lock mode for this object.
  lock_location( );
  // Get a lock for a design object at the requested location.
  unlock_location( );
  // Unlock a lock obtained from lock_location( ).
  resync( );
  // Update this in_memory image to the true current version.
  save( );
  // Make the private session part of the design object public.
  forget( );
  // Forget the session part of the design object.

APPENDIX B-continued

Operations Defining Design Object Behavior repair( );
// Attempt to repair any damage to this object.
Initialization:
constructor( );
// Create a new object.
connect( );
// Connect (initialize) another object.
disconnect( );
// Remove from memory.
initialize( );
// Fully initialize the design object.
do_initialize( );
// Initialize the design object for basic design object operations.
pre_initialize( );
// Set up required state for required for base implementations to work.
Versions:
version_depth( );
// Return the value for the version depth attribute.
version_depth( );
// Set the value for the version depth attribute.
apply_version_depth( );
// Try to apply version depth pruning.
sequence_version( );
// Return a sequence version record for this instance.
create_seq_version( );
// Create the next sequence_version of this object.
next_sequence_version( );
// Return the next sequence version following the given sequence version.
prev_sequence_version( )
// Return the_sequence version immediately preceding the given version.
delete_sequence_version( );
// Delete the given sequence version.
revert( );
// Roll the design object back one sequence version.
check_sequence_version( );
// Check to ensure that the data for the specified version still exists.
current_sequence_number( );
// Return id information about this object's current sequence version.
set_design_object_version( );
// Set the version number of the current version of the design object.
Reference:
reference( );
// Query for a reference record.
add_reference( );
// Add a reference to this design object.
reference_object( );
// Return a Ref (persistent pointer) for the referenced design object.
virtual void remove_reference( );
// Remove the specified reference from the reference list.
change_references( );
// Change Uids and pathnames of references held by this object.
next_reference( );
// Return the next reference following the given reference.
prev _reference( );
// Return the reference preceding the given reference.
Design Management support:
copy( );
// Copy a sequence version of this design object.
copy_all( );
// Copy this design object.
move( );
// Move this design object.
dtor( );
// Destroy this object.
freeze( );
// Freeze the specified sequence version.
unfreeze( );
// Unfreeze the specified sequence version.

APPENDIX B-continued

Operations Defining Design Object Behavior

```
frozen( );
// TRUE if this sequence version is frozen.
released( );
// TRUE if this instance is released.
release( );
// Set this object's release state.
Miscellaneous:
get_protection( );
// Return the protections for the specified design object.
set_protection( );
// Set the file system protections for the specified design
object.
modified_time( );
// Time when the object's data was last modified.
exists( );
// Check if the specified design object exists.
complete( );
// Check if this object has all the requisite pieces.
```

We claim:

1. In a computer automated design system having a display, memory and multiple software tools for operating on data files representing a design, a method of managing design data for ease of manipulation by a user, the method comprising the following steps:

providing in memory a design object type that includes a fileset definition of multiple data files representing related but distinct aspects of the design object type;

creating an instance of the design object type, the data files of the instance each containing design data on a related aspect of a particular design represented by the instance;

providing on the display a symbol visible to a user which represents the instance;

associating with the design object type a software tool that is invoked upon opening of the instance; and in response to an opening of the instance, opening all of the data files in the fileset corresponding to the instance and combining the data of the data files to provide the particular design and invoking the associated software tool for communication with the data files.

2. The method of claim 1 wherein representing each instance of the design object with a symbol comprises displaying an icon on the display screen.

3. The method of claim 1 in which the computer system contains files not represented by a defined object type, wherein such files are represented by design objects of a default type.

4. The method of claim 1 wherein the step of defining a design object type comprises executing a tool adapted for constructing design objects.

5. The method of claim 1 including representing multiple versions of the fileset by the design object, the multiple versions accessible for selective manipulation.

6. The method of claim 1 including editing an instance of the design object data type.

7. The method of claim 1 wherein associating with the design object type a software tool includes associating a default tool.

8. The method of claim 1 wherein associating with the design object type a software tool includes providing a list of tools from which a tool is chosen for association.

9. The method of claim 1 including attaching properties to the design object type.

10. In a computer automated design system having a display, memory and multiple software tools for operating on data files representing a design, apparatus for managing design data for ease of manipulation by a user, comprising:

means for providing in memory a design object type that includes a fileset definition of multiple data files representing related but distinct aspects of the design object type;

means for creating an instance of the design object type, the data files of the instance each containing design data on a related aspect of a particular design represented by the instance;

means for providing on the display a symbol visible to a user which represents the instance;

means for associating with the design object type a software tool that is invoked upon opening of the instance;

means for opening, in response to an opening of the instance, all of the data files in the fileset corresponding to the instance and combining the data of the data files to provide the particular design; and means for invoking the associated software tool for communication with the data files.

11. The apparatus of claim 10 wherein the means for providing a symbol on the display comprises means for displaying an icon on the display.

12. The apparatus of claim 10 wherein the computer system contains files not represented by a defined object type, wherein such files are represented by design objects of a default type.

13. The apparatus of claim 10 wherein the means for providing a design object type comprises a software tool adapted for constructing design object types.

14. The apparatus of claim 10 including means for representing multiple versions of the fileset by the design object type, the multiple versions accessible for selective manipulation.

15. The apparatus of claim 10 including means for editing an instance of the design object data type.

16. The apparatus of claim 10 wherein the associated software tool is a default tool.

17. The apparatus of claim 10 wherein the associated software tool is chosen from a list of tools.

18. The apparatus of claim 10 including means for attaching properties to the design object type.

* * * * *